US008664638B2

(12) United States Patent
Yoo et al.

(10) Patent No.: US 8,664,638 B2
(45) Date of Patent: Mar. 4, 2014

(54) LIGHT-EMITTING DIODE HAVING AN INTERLAYER WITH HIGH VOLTAGE DENSITY AND METHOD FOR MANUFACTURING THE SAME

(75) Inventors: Hong Jae Yoo, Ansan-si (KR); Kyung Hee Ye, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/392,060

(22) PCT Filed: Aug. 25, 2010

(86) PCT No.: PCT/KR2010/005708
§ 371 (c)(1),
(2), (4) Date: Feb. 23, 2012

(87) PCT Pub. No.: WO2011/025266
PCT Pub. Date: Mar. 3, 2011

(65) Prior Publication Data
US 2012/0145992 A1 Jun. 14, 2012

(30) Foreign Application Priority Data
Aug. 28, 2009 (KR) .................... 10-2009-0080815

(51) Int. Cl.
*H01L 29/06* (2006.01)
*H01L 33/00* (2010.01)
*H01L 21/00* (2006.01)
(52) U.S. Cl.
USPC ................. 257/13; 438/46; 257/101
(58) Field of Classification Search
USPC ................................ 438/37
See application file for complete search history.

(56) References Cited

U.S. PATENT DOCUMENTS 5,679,965 A * 10/1997 Schetzina .............. 257/103
7,825,417 B2 * 11/2010 Sakai et al. ............ 257/79
(Continued)

FOREIGN PATENT DOCUMENTS

JP 2003-234503 8/2003
KR 10-2001-0108374 12/2001
(Continued)

OTHER PUBLICATIONS

International Search Report of PCT/KR2010/005708 dated, Feb. 28, 2011.

*Primary Examiner* — Matthew Landau
*Assistant Examiner* — Priya Rampersaud
(74) *Attorney, Agent, or Firm* — H.C. Park & Associates, PLC

(57) ABSTRACT

Disclosed herein are gallium nitride based light emitting diodes having interlayers with high dislocation density and a method of fabricating the same. The light emitting diode includes: a substrate; a buffer layer disposed on the substrate; an n-type contact layer disposed on the buffer; a p-type contact layer disposed on the n-type contact layer; an active layer interposed between the n-type contact layer and the p-type contact layer; a first lower semiconductor layer interposed between the buffer layer and the n-type contact layer; and a first interlayer interposed between the first lower semiconductor layer and the n-type contact layer, wherein the first interlayer has lower dislocation density than the buffer layer and higher dislocation density than the first lower semiconductor layer. This way, the interlayers with higher dislocation density prevent dislocations formed within the first lower semiconductor layer from being transferred to the n-type contact layer.

26 Claims, 3 Drawing Sheets

(56) References Cited

U.S. PATENT DOCUMENTS

| | | | |
|---|---|---|---|
| 2001/0035531 A1* | 11/2001 | Kano et al. | 257/96 |
| 2003/0178642 A1 | 9/2003 | Tanaka et al. | |
| 2003/0222266 A1 | 12/2003 | Sakai et al. | |
| 2004/0094084 A1 | 5/2004 | Ouchi et al. | |
| 2006/0017073 A1* | 1/2006 | Hata et al. | 257/222 |
| 2008/0099781 A1 | 5/2008 | Choi et al. | |
| 2009/0166608 A1* | 7/2009 | Nakanishi et al. | 257/13 |

FOREIGN PATENT DOCUMENTS

| | | |
|---|---|---|
| KR | 10-0665301 | 1/2007 |
| KR | 10-0699057 | 3/2007 |
| KR | 10-0818452 | 4/2008 |

* cited by examiner

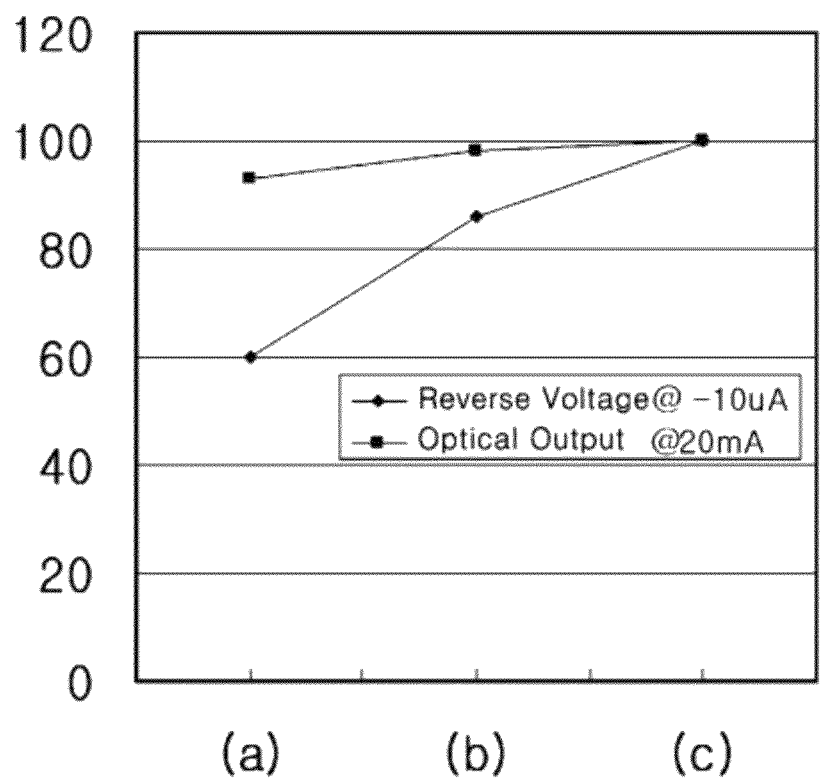

LIGHT-EMITTING DIODE HAVING AN INTERLAYER WITH HIGH VOLTAGE DENSITY AND METHOD FOR MANUFACTURING THE SAME

CROSS-REFERENCE TO RELATED APPLICATIONS

This application is the National Stage Entry of International Application PCT/KR2010/005708, filed on Aug. 25, 2010, and claims priority from and the benefit of Korean Patent Application No. 10-2009-0080815, filed on Aug. 28, 2009, both of which are hereby incorporated by reference for all purposes as if fully set forth herein.

BACKGROUND

1. Field

The present invention relates to a light emitting diode and a method of fabricating the same, and more particularly, to a light emitting diode having an interlayer with high dislocation density and a method of fabricating the same.

2. Discussion of the Background

Generally, gallium nitride-based compound semiconductors such as gallium nitride (GaN), aluminum nitride (AlN), indium gallium nitride (InGaN), or the like, have a direct transition type energy band structure having excellent thermal stability, which have recently been in the limelight as materials for blue and ultraviolet light emitting diode. In particular, the indium gallium nitride compound semiconductor has been of great interest due to a narrow bandgap. The light emitting diode using the gallium nitride-based compound semiconductor has been used in various applications, such as a large-scale color flat panel device, a signal lamp, interior lighting, a high density light source, a high-resolution output system, optical communications, and the like.

A nitride semiconductor layer of III-group elements is grown on a heterogeneous substrate of sapphire or silicon carbide (SiC) having a hexagonal structure, or the like, by a process of a metal organic chemical vapor deposition method (MOCVD), or the like. However, when the nitride semiconductor layer of III-group elements is formed on the heterogeneous substrate, cracks or dislocations occur within the semiconductor layer due to a difference of a lattice constant and a thermal expansion coefficient between the semiconductor layer and the substrate.

The cracks or dislocations occurring within the semiconductor layer, in particular, an active layer or layers adjacent thereto aggravate characteristics of the light emitting diode. Therefore, in order to mitigate a stress caused by a difference in the lattice constant and the thermal expansion coefficient between the substrate and the semiconductor layer, a buffer layer is generally used.

FIG. 1 is a cross-sectional view for describing a method of fabricating a gallium nitride-based light emitting diode according to the related art.

Referring to FIG. 1, a buffer layer 13 is formed on the substrate 11. The buffer layer 13 is generally made of $Al_xGa_{1-x}N$ ($0 \leq x \leq 1$) at a temperature of 400 to 600° C. by using the MOCVD process, or the like. Then, a lower semiconductor layer 15 is formed on the buffer layer 13. The lower semiconductor layer 15 is generally formed of a GaN layer at a temperature of 900 to 1200° C. An n-type GaN contact layer 17, an active layer 19, and a p-type GaN contact layer 21 are formed thereon.

According to the related art, the buffer layer 13 and the lower semiconductor layer 15 may be formed between the n-type contact layer 17 and the substrate 11 to reduce the occurrence of cracks or dislocations, or the like, caused by the differences in the lattice constant and the thermal expansion coefficient between the substrate 11 and the n-type contact layer 17.

However, despite the adaptation of the buffer layer 13 and the lower semiconductor layer 15, a crystal defect density within the active layer 19 is still high. In particular, the dislocation generated in the buffer layer 13 is transferred to the active layer 19 through the lower semiconductor layer 15 and the n-type contact layer 17 to reduce luminous efficiency of the light emitting diode. In addition, the dislocations are transferred to the p-type contact layer to aggravate electrostatic discharge characteristics of the light emitting diode.

Meanwhile, in order to prevent the dislocations generated from the lower semiconductor layer from being transferred to an upper semiconductor layer, an interlayer having a supper-lattice structure may be adopted. The interlayer having the super-lattice structure is formed by alternately growing super thin layers of different compositions, thereby cutting off the dislocation and improving crystallinity of the semiconductor layer formed thereon.

However, in order to form the interlayer having the super-lattice structure, temperature, pressure, and source gas flow of a growth chamber need to be alternately controlled under conditions that each layer is suitably grown within the super-lattice structure. Therefore, an excessive process time to grow the interlayer having the super-lattice structure is required, which excessively increases the process time and the process costs required to fabricating the light emitting diode.

SUMMARY

An object of the present invention is to provide a light emitting diode and a method of fabricating the same capable of preventing dislocations from being transferred.

In addition, another object of the present invention is to provide a light emitting diode with improved electro-static discharge characteristics and a method of fabricating the same.

Further, another object of the present invention is to provide a light emitting diode and a method of fabricating the same capable of preventing time required for a process of fabricating a light emitting diode from being excessively increased using a relatively simple process.

According to an exemplary embodiment of the present invention, there is provided a light emitting diode having an interlayer with high dislocation density. The light emitting diode includes: a substrate: a buffer layer disposed on the substrate; a gallium nitride-based n-type contact layer disposed on the buffer layer; a gallium nitride based p-type contact layer disposed on the n-type contact layer; an active layer interposed between the n-type contact layer and the p-type contact layer; a gallium nitride-based first lower semiconductor layer interposed between the buffer layer and the n-type contact layer; and a gallium nitride-based first interlayer interposed between the first lower semiconductor layer and the n-type contact layer, wherein the first interlayer has higher dislocation density than that of the buffer layer and has higher dislocation density than that of the first lower semiconductor layer. By this configuration, it is possible to prevent dislocation formed within the first lower semiconductor layer from being transferred to the n-type contact layer by the first interlayer having relatively higher dislocation density.

In addition, the first interlayer may have the same composition as that of the first lower semiconductor layer and have the same composition as that of the n-type contact layer.

Further, the second interlayer may be interposed between the first interlayer and the n-type contact layer. The second interlayer may have higher dislocation density than that of the first lower semiconductor layer and have dislocation density different from that of the first interlayer. That is, the plurality of interlayers having higher dislocation density than that of the first lower semiconductor layer may be interposed between the first lower semiconductor layer and the n-type contact layer.

Meanwhile, the second interlayer may have the same composition as that of the first interlayer.

In some exemplary embodiments of the present invention, the gallium nitride-based second lower semiconductor layer may be interposed between the first interlayer and the n-type contact layer. The second lower semiconductor layer may have lower dislocation density than that of the first interlayer.

The second lower semiconductor layer is not particularly limited, but may be grown under the same process condition as the first lower semiconductor layer.

Further, the gallium nitride-based second interlayer may be interposed between the first interlayer and the second lower semiconductor layer. The second interlayer may have higher dislocation density than that of the second lower semiconductor layer and have dislocation density different from that of the first interlayer.

In some exemplary embodiments of the present invention, the first interlayer may be adjacent to the second interlayer. In another exemplary embodiment of the present invention, a third lower semiconductor layer having lower dislocation density than that of the first interlayer and the second interlayer may be interposed therebetween.

Meanwhile, the light emitting diode may further include a gallium nitride-based p-type clad layer interposed between the active layer and the p-type contact layer, a gallium nitride-based first upper semiconductor layer interposed between the clad layer and the p-type contact layer, and a gallium nitride-based first p-type interlayer interposed between the first upper semiconductor layer and the p-type contact layer. The first p-type interlayer may have higher dislocation density than that of the first upper semiconductor layer.

Therefore, it is possible to prevent the dislocation generated in the clad layer from being transferred to the p-type contact layer by the first p-type interlayer having the relatively higher dislocation density.

The first p-type interlayer may have the same composition as that of the first upper semiconductor layer.

In addition, the gallium nitride-based second p-type interlayer may be interposed between the first p-type interlayer and the p-type contact layer. The second p-type interlayer may have higher dislocation density than that of the first upper semiconductor layer and have dislocation density different from that of the first p-type interlayer.

Further, the second p-type interlayer may have the same composition as that of the first p-type interlayer.

In some exemplary embodiments, the gallium nitride-based second upper semiconductor layer may be interposed between the first p-type interlayer and the p-type contact layer. The second upper semiconductor layer may have lower dislocation density than that of the first p-type interlayer.

In addition, the gallium nitride-based second p-type interlayer may be interposed between the first p-type interlayer and the second upper semiconductor layer. The second p-type interlayer may have higher dislocation density than that of the second upper semiconductor layer and have dislocation density different from that of the first p-type interlayer.

In some exemplary embodiments of the present invention, the first p-type interlayer may be adjacent to the second p-type interlayer. In another exemplary embodiment of the present invention, a third upper semiconductor layer having lower dislocation density than that of the first p-type interlayer and the second p-type interlayer may be interposed therebetween.

According to another exemplary embodiment of the present invention, there is provided a method of fabricating a light emitting diode. The method of fabricating a light emitting diode having a gallium nitride-based n-type contact layer, an active layer, and a p-type contact layer, the method includes: forming a buffer layer on a substrate at first temperature; growing a gallium nitride-based first lower semiconductor layer on the buffer layer at second temperature; growing a gallium nitride-based first interlayer on the first lower semiconductor layer at temperature higher than the first temperature and lower than the second temperature; and growing the n-type contact layer on the first interlayer.

Crystallinity of the gallium nitride-based semiconductor layer mainly may depend on a flow ratio (v/III [gas flow ratio]) of growth temperature and source gas thereof. Therefore, the interlayer having relatively higher dislocation density may be interposed between the semiconductor layers by controlling the growth temperature and the gas flow ratio (v/III [gas ratio]) of the gallium nitride-based semiconductor layer. It is possible to prevent the dislocations generated in the lower semiconductor layer from being transferred to the upper semiconductor layers by the interlayer having the relatively higher dislocation density.

In addition, the first interlayer may have the same composition as that of the first lower semiconductor layer and may have the same composition as that of the n-type contact layer.

In some exemplary embodiments of the present invention, the method may further include, prior to growing the n-type contact layer, growing a gallium nitride-based second interlayer on the first interlayer at temperature higher than the first temperature and lower than the second temperature. The growth temperature of the second interlayer may be different from that of the first interlayer. Therefore, the interlayers having different dislocation density may be formed in a multilayer structure.

In addition, the second interlayer may have the same composition as that of the first interlayer.

In some exemplary embodiments of the present invention, the method may further include, prior to growing the n-type contact layer, growing a gallium nitride-based second lower interlayer on the first interlayer at temperature higher than the growth temperature of the first interlayer. In addition, prior to growing the second lower semiconductor layer, the gallium nitride-based second interlayer may be grown on the first interlayer at temperature higher than first temperature and lower than second temperature. In this case, the growth temperature of the second interlayer may be lower than that of the second lower semiconductor layer and be different from that of the first interlayer.

In some exemplary embodiment of the present invention, the second interlayer may be directly grown on the first interlayer. In some exemplary embodiments of the present invention, prior to growing the second interlayer, the gallium nitride-based third lower semiconductor layer may also be grown on the first interlayer at temperature higher than the growth temperature of the first interlayer.

Meanwhile, the method may further include growing the active layer on the n-type contact layer, growing the gallium nitride-based first p-type upper semiconductor layer on the active layer at third temperature, growing the gallium nitride-based first p-type interlayer on the first p-type upper semiconductor layer at temperature higher than the first temperature and lower than the third temperature, and growing the p-type contact layer on the first p-type interlayer.

Further, prior to growing the first p-type upper semiconductor layer, the p-type clad layer may be grown on the active layer.

In addition, the first p-type interlayer may have the same composition as that of the first upper semiconductor layer and have the same composition as that of the p-type contact layer.

In some exemplary embodiments of the present invention, the method may further include, prior to growing the p-type contact layer, growing a gallium nitride-based second p-type interlayer on the first p-type interlayer at temperature higher than the first temperature and lower than the third temperature. The growth temperature of the second p-type interlayer may be different from that of the first p-type interlayer.

Further, the second p-type interlayer may have the same composition as that of the first p-type interlayer.

In some exemplary embodiments of the present invention, the method may further include, prior to growing the p-type contact layer, growing a gallium nitride-based second upper semiconductor layer on the first p-type interlayer at temperature higher than the growth temperature of the first p-type interlayer.

In addition, the method may further include, prior to growing the second upper semiconductor layer, growing a gallium nitride-based second p-type interlayer on a first interlayer at temperature higher than the first temperature and lower than the growth temperature of the second upper semiconductor layer. The growth temperature of the second p-type interlayer may be different from that of the first p-type interlayer.

In some exemplary embodiments of the present invention, prior to the second p-type interlayer, the third upper semiconductor layer may be grown on the first p-type interlayer at temperature higher than the growth temperature of the first p-type interlayer.

According to another exemplary embodiment of the present invention, there is provided a light emitting diode having an active layer between a gallium nitride-based n-type semiconductor layer and a gallium nitride-based p-type semiconductor layer. The light emitting diode includes: a p-type contact layer disposed on the active layer; a gallium nitride-based first upper semiconductor layer interposed between the active layer and the p-type contact layer; and a gallium nitride-based first p-type interlayer interposed between the first upper semiconductor layer and the p-type contact layer; wherein the first p-type interlayer has higher dislocation density than that of the first upper semiconductor layer.

The first p-type interlayer may have the same composition as that of the p-type contact layer. In addition, the second p-type interlayer may be interposed between the first p-type interlayer and the p-type contact layer. Further, the third upper semiconductor layer may be interposed between the first p-type interlayer and the second p-type interlayer. The third upper semiconductor layer may have lower dislocation density than that of the first p-type interlayer and the second p-type interlayer.

Meanwhile, the third upper semiconductor layer may not be intentionally doped with impurities or may have lower doping concentration than that of the first p-type interlayer and the second p-type interlayer.

In addition, the second upper semiconductor layer may be interposed between the second p-type interlayer and the p-type contact layer and the second upper semiconductor layer may have lower dislocation density than that of the first and second p-type interlayers.

According to the exemplary embodiment of the present invention, the interlayer having the relatively high dislocation density is disposed between the semiconductor layers, thereby making it possible to prevent the dislocation generated in the lower semiconductor layer from being transferred to the upper semiconductor layer. Further, the process time of fabricating the light emitting diode can be shortened than that of the interlayer having the super-lattice structure, by adopting the interlayer having the relatively high dislocation density. In addition, the light emitting diode with the improved electro-static discharge characteristics can reduce the dislocation density within the p-type contact layer.

BRIEF DESCRIPTION OF THE DRAWINGS

FIG. 5 is a graph for describing optical output and electro-static discharge characteristics of a light emitting diode according to exemplary embodiments of the present invention.

DETAILED DESCRIPTION OF EXEMPLARY EMBODIMENTS

Figure 1:
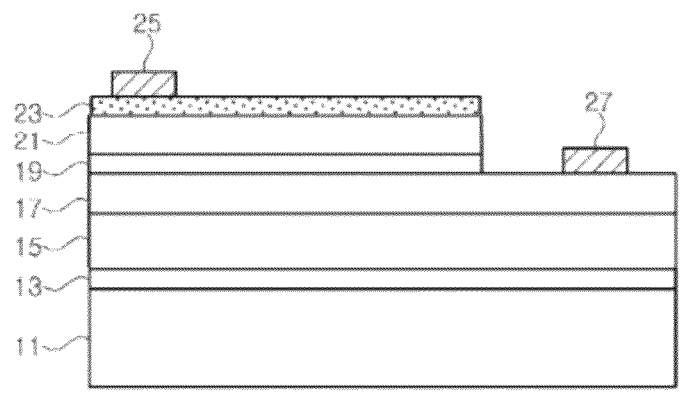
FIG. 1 is a cross-sectional view for describing a method of fabricating a light emitting diode according to the related art.

Hereinafter, exemplary embodiments of the present invention will be described in detail with reference to the accompanying drawings. The exemplary embodiments of the present invention to be described below are provided by way of example so that the idea of the present invention can be sufficiently transferred to those skilled in the art to which the present invention pertains. Therefore, the present invention is not limited to the exemplary embodiments set forth herein but may be modified in many different forms. In the accompanying drawings, like reference numerals are used to describe like components and widths, lengths, thicknesses, or the like, of components may be exaggerated for convenience.

Figure 2:
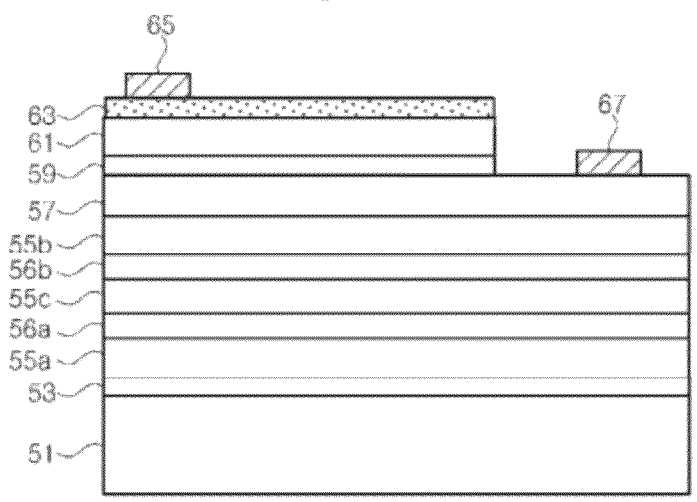
FIG. 2 is a cross-sectional view for describing a light emitting diode according to an exemplary embodiment of the present invention.

FIG. 2 shows a light emitting diode according to an exemplary embodiment of the present invention.

Referring to FIG. 2, the light emitting diode includes a substrate 51, a buffer layer 53, a first lower semiconductor layer 55a, a first interlayer 56a, an n-type contact layer 57, an active layer 59, and a p-type contact layer 61. In addition, the light emitting diode may also include a second interlayer 56b, a second upper semiconductor layer 55b, a transparent electrode 63, and electrode pads 65 and 67.

The substrate 51 is a heterogeneous substrate for growing gallium nitride-based semiconductor layers and is not particularly limited. Therefore, an example of the substrate may include a substrate of sapphire, spinel, silicon carbide, or the like. Meanwhile, the buffer layer 53 may generally be made of $Al_xGa_{1-x}N$ ($0 \leq x \leq 1$). The buffer layer 53 is referred to as a low-temperature buffer layer or a nuclear layer in the art and is formed on the substrate 51 by a metal organic chemical vapor deposition method at a temperature (first temperature) of 400 to 650° C., preferably, 550 to 650° C.

The first lower semiconductor layer 55a may be grown on the buffer layer 53 by the organic chemical vapor deposition method at a temperature (second temperature) of 900 to 1200° C., preferably, 1050 to 1100° C. The first lower semiconductor layer 55a may be a gallium nitride-based semiconductor layer, for example, undoped GaN that is not intentionally doped with impurities or n type GaN doped with n-type impurities.

A first interlayer 56a is disposed on the first lower semiconductor layer 55a. The first interlayer 56a has higher dislocation density than the first lower semiconductor layer 55a. The dislocations within the first interlayer 56a changes a direction of dislocations vertically transferred from the first lower semiconductor layer 55a into a horizontal direction. Therefore, it is possible to prevent the dislocations from being transferred vertically.

The first interlayer 56a may be a gallium nitride-based compound semiconductor layer of the same composition as that of the first lower semiconductor layer 55a and may also have the same composition as that of the n-type contact layer 57. The first interlayer 56a is grown at lower temperature than a growth temperature (second temperature) of the first lower semiconductor layer 55a, thereby having higher dislocation density than that of the first lower semiconductor layer 55a. For example, the first interlayer 56a may be grown by the metal organic chemical vapor deposition method at a temperature of 600 to 900° C., preferably, a temperature of 750 to 900° C. In addition, since the first interlayer 56a is grown at a relatively lower temperature than that of the first lower semiconductor layer 55a, a flow of source gas is the same and when temperature is simply lowered, surface morphology may be worsened. Therefore, a flow rate of a source gas of nitrogen, for example, $NH_3$ introduced during the growth of the first interlayer 56a is increased by, for example, 60 to 90% as compared with a flow rate at the time of growing the first lower semiconductor layer 55a, thereby preventing the surface morphology from being worsened.

A second interlayer 56b may be disposed on the first interlayer 56a. Similar to the first interlayer 56a, the second interlayer 56b is also grown at lower temperature than a growth temperature (second temperature) of the first lower semiconductor layer 55a, thereby having higher dislocation density than that of the first lower semiconductor layer 55a. For example, the second interlayer 56b may be grown by the metal organic chemical vapor deposition method at a temperature of 600 to 900° C. The composition of the second interlayer 56b may also be the same as that of the first interlayer 56a. However, the second interlayer 56b is grown under a growth condition, for example, growth temperature, different from that of the first interlayer 56a, which has the dislocation density different from the first interlayer 56a. As such, the plurality of interlayers may be grown so as to gradually reduce the dislocation density by adopting the plurality of interlayers 56a and 56b, which results in improving the crystallinity of the semiconductor layer formed on the interlayers.

Further, the interlayers may be formed so as to be succeeded with one another, but is not limited thereto. Therefore, a third lower semiconductor layer 55c having the lower dislocation density than that of the interlayers may be interposed between the interlayers. The third lower semiconductor layer 55c is grown at higher temperature than that of the interlayers, for example, a temperature of 900 to 1200° C., preferably, a temperature of 1050 to 1100° C. When the third lower semiconductor layer 55c is formed between the interlayers, the third lower semiconductor layer 55c may have a thickness 1.1 to 3 times, preferably, 1.3 to 1.6 times thicker than that of the first interlayer 56a. When the third lower semiconductor layer 55c exceeds 3 times a thickness of the first interlayer layer 56a, it is difficult to achieve an effect of cutting off the dislocation density by inserting the interlayer.

Meanwhile, the second lower semiconductor layer 55b may be disposed on the first interlayer 56a (or second interlayer 56b). The second lower semiconductor layer 55b has the lower dislocation density than that of the interlayers 56a and 56b. The second lower semiconductor layer 55b may be grown by, for example, the organic chemical vapor deposition method at temperature higher than that of the interlayers 56a and 56b, for example, a temperature of 900 to 1200° C., preferably, a temperature of 1050 to 1100° C. Further, the second lower semiconductor layer 55b may be the gallium nitride-based semiconductor layer having the same composition as that of the first lower semiconductor layer 55a, for example, the undoped GaN that is not intentionally doped or the n-type GaN that is doped with the n-type impurity. Meanwhile, the third lower semiconductor layer 55c may be the undoped GaN that is not intentionally doped with impurity.

The gallium nitride-based n-type contact layer 57, the active layer 59, and the p-type contact layer 61 are disposed on the second lower semiconductor layer 55b. The active layer 59 is a layer emitting light by combining electrons and holes and may have a single quantum well structure or a multiple quantum well structure. In addition, the active layer may include an InGaN layer and a clad layer having a wide energy bandgap may be disposed at at least one side of the active layer. The n-type contact layer 57 and the p-type contact layer 59 may be made of GaN at a temperature of 900 to 1200° C., preferably, 1050 to 1100° C. The n-type contact layer, the active layer, and the p-type contact layer may be grown by using the metal organic chemical vapor deposition method.

Meanwhile, the transparent electrode layer 63 may be formed on the p-type contact layer 61 and the p-type electrode pad 65 may be formed on the transparent electrode layer 63. In addition, the n-type electrode pad 67 may be formed on the n-type contact layer 57 exposed by etching the p-type contact layer and the active layer.

According to the exemplary embodiment of the present invention, it is possible to prevent the dislocations from being transferred to the n-type contact layer 57 from the first lower semiconductor layer 55a by inserting the first interlayer 56a having the higher dislocations density than the first lower semiconductor layer 55a between the n-type contact layer 57 and the first lower semiconductor layer 55a, such that the active layer 59 having the excellent crystallinity may be grown. In addition, the first interlayer 56a has the relatively higher crystal defect density than that of the n-type contact layer 57, such that a residual stress within the grown semiconductor layers may be reduced.

In the exemplary embodiment of the present invention, the second interlayer 56b and/or the second upper semiconductor layer 55b may be omitted.

Figure 3:
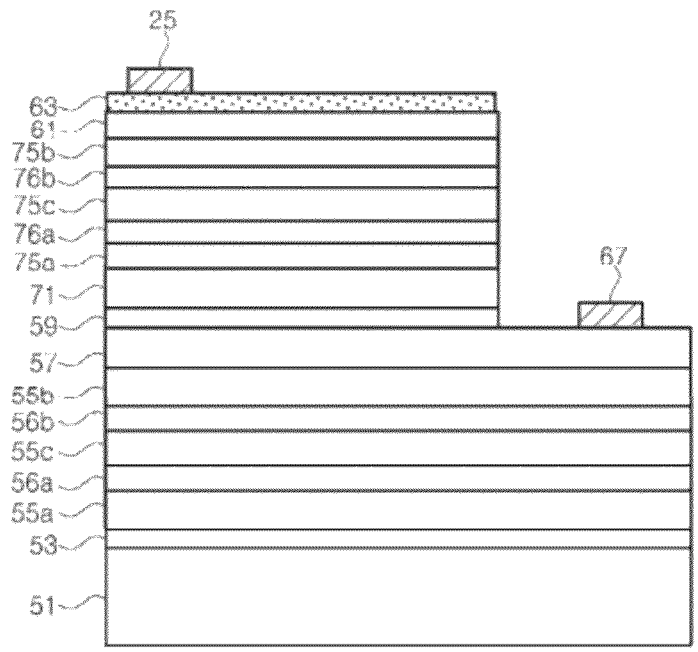
FIG. 3 is a cross-sectional view for describing a light emitting diode according to another exemplary embodiment of the present invention.

FIG. 3 is a cross-sectional view for describing a light emitting diode according to another exemplary embodiment of the present invention.

Referring to FIG. 3, the light emitting diode includes the substrate 51, the buffer layer 53, the first lower semiconductor layer 55a, the first interlayer 56a, the n-type contact layer 57, the active layer 59, a first upper semiconductor layer 75a, a first p-type interlayer 76a, and a p-type contact layer 61. The light emitting diode may also include a p-type clad layer 71, the second p-type interlayer 76b, the second upper semiconductor layer 75b, the transparent electrode 63, and the electrode pads 65 and 67.

The light emitting diode according to the exemplary embodiment of the present invention is approximately similar to the light emitting diode described with reference to FIG. 2 and therefore, only the difference therebetween will be described so as to avoid the repeated description thereof.

The p-type clad layer 71 may be interposed between the p-type contact layer 61 and the active layer 59. The p-type clad layer 71 is formed of the gallium nitride-based semiconductor layer, for example, AlGaN wider than that of the active layer 59.

The gallium nitride-based first upper semiconductor layer 75a is disposed on the p-type clad layer 71. The first upper semiconductor layer 75a may be grown by using the MOCVD process at a third temperature of 900 to 1200° C., preferably, a temperature of 1050 to 1100° C. and may be grown as the GaN layer doped with, for example, the p-type impurity.

Meanwhile, the first interlayer 76a is disposed on the first upper semiconductor layer 75a. The first p-type interlayer 76a has higher dislocation density than the first upper semiconductor layer 75a. The dislocations within the first p-type interlayer 76a changes a direction of dislocations vertically transferred from the first upper semiconductor layer 75a to the active layer into a horizontal direction. Therefore, it is possible to prevent the dislocations from being transferred vertically.

The first p-type interlayer 76a may be the gallium nitride-based compound semiconductor layer having the same composition as that of the first upper semiconductor layer 75a, for example, the GaN and may also have the same composition as that of the p-type contact layer 61. The first p-type interlayer 76a is grown at lower temperature than a growth temperature (third temperature) of the first upper semiconductor layer 75a, thereby having higher dislocation density than that of the first upper semiconductor layer 75a. For example, the first p-type interlayer 76a may be grown by the metal organic chemical vapor deposition method at a temperature of 600 to 900° C., preferably, 750 to 900° C. In addition, in order to grow the first p-type interlayer 76a at relatively lower temperature, a flow rate of the source gas of nitrogen, for example, NH$_3$ introduced during the growth of the first p-type interlayer 76a may be preferably increased by, for example, 60 to 90% than a flow rate introduced during the growth of the first upper semiconductor layer 75a.

A second p-type interlayer 76b may be disposed on the first p-type interlayer 76a. Similar to the first p-type interlayer 76a, the second p-type interlayer 76b is also grown at lower temperature than a growth temperature (third temperature) of the first upper semiconductor layer 75a, thereby having the higher dislocation density than that of the first upper semiconductor layer 75a. For example, the second p-type interlayer 76b may be grown by the metal organic chemical vapor deposition method at a temperature of 600 to 900° C., preferably, a temperature of 750 to 900° C. The composition of the second p-type interlayer 76b may also be the same as that of the first p-type interlayer 76a. However, the second p-type interlayer 76b is grown under the growth condition, for example, the growth temperature, different from that of the first p-type interlayer 76a, which has the dislocation density different from the first p-type interlayer 76a. As such, the plurality of p-type interlayers may be grown so as to gradually reduce the dislocation density by adopting the plurality of interlayers 76a and 76b, which results in improving the crystallinity of the semiconductor layer formed on the interlayers. The first and second p-type interlayers 76a and 76b may be relatively thinner than the interlayers formed at an n side, that is, the first interlayer 56a and the second interlayer 56b.

The p-type interlayers 76a and 76b may be formed so as to be adjacent to each other but are not limited thereto. Therefore, the third upper semiconductor layer 75c may be interposed between the p-type interlayers 76a and 76b. The third upper semiconductor layer 75c may be grown at, for example, a temperature of 900 to 1200° C., preferably, 1050 to 1100° C. higher than the growth temperature of the p-type interlayers 76a and 76b. In addition, the third upper semiconductor layer 75c may have a thickness 1.1 to 3 times, preferably, 1.3 to 1.6 times thicker than that the first p-type interlayer 76a. The third upper semiconductor layer 75c may not be intentionally doped with impurities and may be doped at lower concentration than the first p-type interlayer 76a and the second p-type interlayer 76b even though the doping is performed.

Meanwhile, the second lower semiconductor layer 75b may be disposed on the first p-type interlayer 76a (or second p-type interlayer 76b). The second upper semiconductor layer 75b has the lower dislocation density than that of the p-type interlayers 76a and 76b. The second upper semiconductor layer 75b may be grown by the metal organic chemical vapor deposition method at a temperature higher than that of the p-type interlayers 76a and 76b, for example, at a temperature of 900 to 1200° C. In addition, the second and third upper semiconductor layers 75b and 75c may be the gallium nitride-based semiconductor layer, for example, GaN having the same composition as that of the first upper semiconductor layer 75a.

The p-type contact layer 61 is disposed on the first p-type interlayer 76a and the transparent electrode 63 and the p-type electrode pad 65 are disposed on the p-type contact layer 61. Meanwhile, the n-type electrode pad 67 is disposed on the n-type contact layer 59 exposed by etching the p-type contact layer 61, the upper semiconductor layers 75a and 75b, the interlayers 76a and 76b, and the p-type clad layer 71.

According to the exemplary embodiment of the present invention, it is possible to prevent the dislocations from being transferred from the first upper semiconductor layer 75a to the p-type contact layer 61 by inserting the first p-type interlayer 76a having the relatively higher dislocation density between the p-type contact layer 61 and the first upper semiconductor layer 75a. Therefore, the electro-static discharge characteristics of the light emitting diode can be improved by growing the p-type contact layer 61 having the excellent crystallinity.

Figure 4:
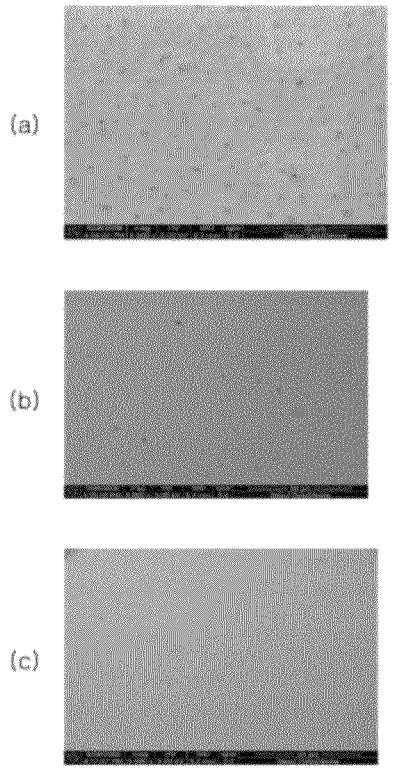
FIG. 4 is SEM images for describing surface characteristics of a light emitting diode according to exemplary embodiments of the present invention.

FIG. 4 is SEM images for describing surface characteristics of a light emitting diode according to exemplary embodiments of the present invention. Here, FIG. 4A is a surface SEM image of a sample which is formed up to the p-type contact layer without forming the interlayer, FIG. 4B is a surface SEM image of a sample which is formed up to the p-type contact layer with the first and second interlayers 56a and 56b formed on the lower portion of the n-type contact layer 57, and FIG. 4C is a surface SEM image of a sample which is formed up to the p-type contact layer with the first and the second p-type interlayers 76a and 76b formed in addition to the first and second interlayers 56a and 56b according to another exemplary embodiment of the present invention.

As can be appreciated from FIG. 4, it was observed that the surface of the sample, in which the interlayer is not formed, has considerable roughness and the surface thereof is provided with a plurality of etch pits. It is determined that the etch pits are generated by the dislocations transferred from the lower semiconductor layers. Meanwhile, in the case of the FIG. 4B, the surface thereof is considerably improved than a conventional sample (a) in which the interlayer is not formed. and in the case of FIG. 4C, the surface thereof is more improved.

Therefore, it can be appreciated that the number of dislocations transferred to the p-type contact layer via the active layer may be reduced by forming the interlayers 56a and 56b at the n side and the number of dislocations may be more reduced by forming the interlayers 76a and 76b at the p side.

FIG. 5 is a graph for describing optical output and electrostatic discharge characteristics of a light emitting diode according to the exemplary embodiments of the present invention. In this case, the light emitting diode is manufactured on each substrate using the same samples (a), (b), and (c) as FIG. 4 and the optical output is measured at forward current 20 mA to represent a relative value. Further, the relative value was represented by measuring reverse voltage when leakage current is −10 μA.

As can be appreciated from FIG. 5, the optical output and the reverse voltage of the samples in which the interlayer is formed is more increased than the sample in which the interlayer is not formed. Further, it can be appreciated that the optical output and the reverse voltage are more increased by adding the interlayer in the p-side region. In particular, it can be appreciated from the increase in the reverse voltage that the electro-static discharge characteristics are improved by adding the interlayer in the p side region.

The invention claimed is:

1. A light emitting diode, comprising:
a substrate;
a buffer layer disposed on the substrate;
a gallium nitride-based n-type contact layer disposed on the buffer layer;
a gallium nitride based p-type contact layer disposed on the gallium nitride-based n-type contact layer;
an active layer interposed between the gallium nitride-based n-type contact layer and the gallium nitride-based p-type contact layer;
a gallium nitride-based first lower semiconductor layer interposed between the buffer layer and the gallium nitride-based n-type contact layer;
a gallium nitride-based first interlayer interposed between the gallium nitride-based first lower semiconductor layer and the gallium nitride-based n-type contact layer; and
a gallium nitride-based second interlayer interposed between the gallium nitride-based first interlayer and the gallium nitride-based n-type contact layer,
wherein the gallium nitride-based second interlayer has higher dislocation density than that of the gallium nitride-based first lower semiconductor layer and has dislocation density different from that of the gallium nitride-based first interlayer,
wherein the gallium nitride-based first interlayer comprises a single composition and has lower dislocation density than that of the buffer layer and has higher dislocation density than that of the gallium nitride-based first lower semiconductor layer, and
wherein the gallium nitride-based first interlayer comprises the same composition as that of the gallium nitride-based n-type contact layer.

2. The light emitting diode of claim 1, further comprising:
a third lower semiconductor layer interposed between the gallium nitride-based first interlayer and the gallium nitride-based second interlayer,
wherein the third lower semiconductor layer has lower dislocation density than that of the gallium nitride-based first interlayer and the gallium nitride-based second interlayer.

3. The light emitting diode of claim 2, wherein the third lower semiconductor layer has lower impurity concentration than that of the gallium nitride-based first interlayer and the gallium nitride-based second interlayer.

4. The light emitting diode of claim 1, further comprising:
a gallium nitride-based second lower semiconductor layer interposed between the gallium nitride-based first interlayer and the gallium nitride-based n-type contact layer,
wherein the gallium nitride-based second lower semiconductor layer has lower dislocation density than that of the gallium nitride-based first interlayer.

5. The light emitting diode of claim 4, further comprising:
a gallium nitride-based second interlayer interposed between the gallium nitride-based first interlayer and the gallium nitride-based second lower semiconductor layer,
wherein the gallium nitride-based second interlayer has higher dislocation density than that of the gallium nitride-based second lower semiconductor layer and has dislocation density different from that of the gallium nitride-based first interlayer.

6. The light emitting diode of claim 1, further comprising:
a gallium nitride-based first upper semiconductor layer interposed between the active layer and the gallium nitride-based p-type contact layer; and
a gallium nitride-based first p-type interlayer interposed between the gallium nitride-based first upper semiconductor layer and the gallium nitride based p-type contact layer,
wherein the gallium nitride-based first p-type interlayer has higher dislocation density than that of the gallium nitride-based first upper semiconductor layer.

7. The light emitting diode of claim 6, wherein the gallium nitride-based first p-type interlayer has the same composition as that of the gallium nitride based p-type contact layer.

8. The light emitting diode of claim 6, further comprising:
a gallium nitride-based second p-type interlayer interposed between the first p-type interlayer and the gallium nitride based p-type contact layer,
wherein the gallium nitride-based second p-type interlayer has higher dislocation density than that of the gallium nitride-based first upper semiconductor layer and has dislocation density different from that of the gallium nitride-based first p-type interlayer.

9. The light emitting diode of claim 8, further comprising:
a third upper semiconductor layer interposed between the gallium nitride-based first p-type interlayer and the gallium nitride-based second p-type interlayer,
wherein the third upper semiconductor layer has lower dislocation density than that of the gallium nitride-based first p-type interlayer and the gallium nitride-based second p-type interlayer.

10. The light emitting diode of claim 6, further comprising:
a gallium nitride-based second upper semiconductor layer interposed between the gallium nitride-based first p-type interlayer and the gallium nitride based p-type contact layer,
wherein the gallium nitride-based second upper semiconductor layer has lower dislocation density than that of the gallium nitride-based first p-type interlayer.

11. The light emitting diode of claim 10, further comprising:
a gallium nitride-based second p-type interlayer interposed between the gallium nitride-based first p-type interlayer and the gallium nitride-based second upper semiconductor layer,
wherein the gallium nitride-based second p-type interlayer has higher dislocation density than that of the gallium nitride-based second upper semiconductor layer and has dislocation density different from that of the gallium nitride-based first p-type interlayer.

12. A method of fabricating a light emitting diode having a gallium nitride-based n-type contact layer, an active layer, and a p-type contact layer, the method comprising:
- forming a buffer layer on a substrate at a first temperature;
- growing a gallium nitride-based first lower semiconductor layer on the buffer layer at a second temperature;
- growing a gallium nitride-based first interlayer on the gallium nitride-based first lower semiconductor layer at temperature higher than the first temperature and lower than the second temperature;
- growing the gallium nitride-based n-type contact layer on the gallium nitride-based first interlayer; and
- prior to growing the gallium nitride-based n-type contact layer, growing a gallium nitride-based second interlayer on the gallium nitride-based first interlayer at temperature higher than the first temperature and lower than the second temperature,
- wherein growth temperature of the gallium nitride-based second interlayer is different from that of the gallium nitride-based first interlayer, and
- wherein the gallium nitride-based first interlayer comprises a single composition that is the same composition as that of the gallium nitride-based n-type contact layer.

13. The method of claim 12, wherein the gallium nitride-based second interlayer has the same composition as that of the gallium nitride-based first interlayer.

14. The method of claim 12, further comprising:
- prior to growing the gallium nitride-based n-type contact layer, growing a gallium nitride-based second lower semiconductor layer on the gallium nitride-based first interlayer at temperature higher than the growth temperature of the gallium nitride-based first interlayer.

15. The method of claim 14, further comprising:
- prior to growing the gallium nitride-based second lower semiconductor layer, growing a gallium nitride-based second interlayer on the gallium nitride-based first interlayer at temperature higher than the first temperature and lower than the second temperature,
- wherein the growth temperature of the gallium nitride-based second interlayer is lower than that of the gallium nitride-based second lower semiconductor layer and is different from that of the gallium nitride-based first interlayer.

16. The method of claim 12, further comprising:
- growing the active layer on the gallium nitride-based n-type contact layer;
- growing a gallium nitride-based first p-type upper semiconductor layer on the active layer at a third temperature;
- growing a gallium nitride-based first p-type interlayer on the gallium nitride-based first p-type upper semiconductor layer at temperature higher than the first temperature and lower than the third temperature; and
- growing the p-type contact layer on the gallium nitride-based first p-type interlayer.

17. The method of claim 16, wherein the gallium nitride-based first p-type interlayer has the same composition as that of the gallium nitride-based first p-type upper semiconductor layer.

18. The method of claim 16, further comprising:
- prior to growing the p-type contact layer, growing a gallium nitride-based second p-type interlayer on the gallium nitride-based first p-type interlayer at temperature higher than the first temperature and lower than the third temperature,
- wherein the growth temperature of the gallium nitride-based second p-type interlayer is different from that of the gallium nitride-based first p-type interlayer.

19. The method of claim 18, wherein the gallium nitride-based second p-type interlayer has the same composition as that of the gallium nitride-based first p-type interlayer.

20. The method of claim 16, further comprising:
- prior to growing the p-type contact layer, growing a gallium nitride-based second upper semiconductor layer on the gallium nitride-based first p-type interlayer at temperature higher than the growth temperature of the gallium nitride-based first p-type interlayer.

21. The method of claim 20, further comprising:
- prior to growing the gallium nitride-based second upper semiconductor layer, growing a gallium nitride-based second p-type interlayer on the gallium nitride-based first p-type interlayer at temperature higher than the first temperature and at temperature lower than that of the gallium nitride-based second upper semiconductor layer,
- wherein the growth temperature of the gallium nitride-based second p-type interlayer is different from that of the gallium nitride-based first p-type interlayer.

22. A light emitting diode having an active layer between a gallium nitride-based n-type semiconductor layer and a gallium nitride-based p-type semiconductor layer, the light emitting diode comprising:
- a p-type contact layer disposed on the active layer;
- a gallium nitride-based first upper semiconductor layer interposed between the active layer and the p-type contact layer;
- a gallium nitride-based first p-type interlayer interposed between the gallium nitride-based first upper semiconductor layer and the p-type contact layer; and
- a third upper semiconductor layer interposed between the gallium nitride-based first p-type interlayer and a gallium nitride-based second p-type interlayer,
- wherein the third upper semiconductor layer has lower dislocation density than that of the gallium nitride-based first p-type interlayer and the gallium nitride-based second p-type interlayer,
- wherein the gallium nitride-based first p-type interlayer has the same composition as that of the p-type contact layer, and
- wherein the gallium nitride-based first p-type interlayer has higher dislocation density than that of the gallium nitride-based first upper semiconductor layer.

23. The light emitting diode of claim 22, wherein the gallium nitride-based second p-type interlayer is interposed between the gallium nitride-based first p-type interlayer and the p-type contact layer.

24. The light emitting diode of claim 22, wherein the third upper semiconductor layer is not intentionally doped with impurities or has lower doping concentration than that of the gallium nitride-based first type interlayer and the gallium nitride-based second p-type interlayer.

25. The light emitting diode of claim 24, further comprising:
- a second upper semiconductor layer interposed between the gallium nitride-based second p-type interlayer and the p-type contact layer,
- wherein the second upper semiconductor layer has lower dislocation density than that of the gallium nitride-based first and second p-type interlayers.

26. The method of claim 12, wherein growing a gallium nitride-based first interlayer comprises supplying a nitrogen source gas at a higher rate than that for growth of the gallium nitride-based first lower semiconductor layer.

* * * * *